United States Patent
Cloury et al.

(10) Patent No.: US 9,176,189 B2
(45) Date of Patent: Nov. 3, 2015

(54) CONNECTION SYSTEM AND SIMULATOR USING SUCH A CONNECTION SYSTEM

(75) Inventors: Emmanuel Cloury, Daux (FR); David Grand, Toulouse (FR); Patrick Oms, Colomiers (FR); Michel Paulard, La Salvetat Saint-Gilles (FR)

(73) Assignee: AIRBUS OPERATIONS SAS, Toulouse (FR)

( * ) Notice: Subject to any disclaimer, the term of this patent is extended or adjusted under 35 U.S.C. 154(b) by 288 days.

(21) Appl. No.: 13/578,126

(22) PCT Filed: Feb. 16, 2011

(86) PCT No.: PCT/FR2011/000093
§ 371 (c)(1),
(2), (4) Date: Nov. 20, 2012

(87) PCT Pub. No.: WO2011/101559
PCT Pub. Date: Aug. 25, 2011

(65) Prior Publication Data
US 2013/0060970 A1   Mar. 7, 2013

(30) Foreign Application Priority Data

Feb. 16, 2010  (FR) .................... 10 51079

(51) Int. Cl.
| | |
|---|---|
| G06F 13/00 | (2006.01) |
| G01R 31/317 | (2006.01) |
| G06F 1/26 | (2006.01) |
| G01R 31/319 | (2006.01) |

(52) U.S. Cl.
CPC .... *G01R 31/31722* (2013.01); *G01R 31/31723* (2013.01); *G01R 31/31905* (2013.01); *G06F 1/263* (2013.01)

(58) Field of Classification Search
CPC ........................................ G06F 1/263
USPC .......................................... 710/14
See application file for complete search history.

(56) References Cited

U.S. PATENT DOCUMENTS

| | | | | |
|---|---|---|---|---|
| 5,764,546 | A * | 6/1998 | Bryant et al. | 702/108 |
| 6,311,149 | B1 * | 10/2001 | Ryan et al. | 703/21 |
| 2003/0038842 | A1 | 2/2003 | Peck et al. | |
| 2007/0001790 | A1 * | 1/2007 | Richmond et al. | 335/2 |
| 2008/0212570 | A1 * | 9/2008 | Chen | 370/352 |
| 2008/0313442 | A1 * | 12/2008 | Wei et al. | 712/227 |
| 2010/0180138 | A1 * | 7/2010 | Yen et al. | 713/324 |

OTHER PUBLICATIONS

International Search Report Issued Apr. 13, 2011 in PCT/FR11/00093 Filed Feb. 16, 2011.

* cited by examiner

*Primary Examiner* — Henry Tsai
*Assistant Examiner* — John Roche
(74) *Attorney, Agent, or Firm* — Oblon, McClelland, Maier & Neustadt, L.L.P.

(57) ABSTRACT

A system for connecting a plurality of plugs to a computer system, such as a simulator, which includes: a plurality of channels that are each connected to a plug and are selectively configurable in a first mode, for acquiring a signal that is present on the plug, or in a second mode for applying a signal to the plug; and a unit that is connected to the computer system by an information system and configured so as to control, in the channels configured in the second mode, application of a signal on the basis of data received from the computer system and so as to send data, representing signals that are measured by the configured channels in the first mode, to the computer system.

9 Claims, 2 Drawing Sheets

CONNECTION SYSTEM AND SIMULATOR USING SUCH A CONNECTION SYSTEM

The invention relates to a connection system, which may be used, for example, to connect components to be tested, such as equipment items, sensors and/or actuators, to a simulator capable of simulating a real environment, in other words the operation of other components of the system to be tested. The invention also relates to such a simulator using this connection system.

During the development and testing of complex systems, such as an airplane, it is desired to make all or part of the components of the system operate prior to a real test (such as the maiden flight of the airplane) under conditions as representative as possible of the conditions to which the component or components will be subjected.

This is done by using computer systems commonly known as simulators, which communicate with the components under test by means of electrical signals identical to those present in real operation, thus simulating for the component an environment identical to that known in real operation.

Traditionally, the components and the simulator used to be connected, for reasons of investigation, development and/or corrections, by means of cutoff and visual display boxes comprising a large number of connectors, each having a specific function and equipped with cutoff switches and being connected for this purpose to an electronic card permitting operation of a given type associated with this function.

In this way each card assured, for example, either an input role, in other words acquisition of signals present on the connectors connected to it, or an output role, in other words application of a given signal to each connector connected to it, upon command from the simulator.

The fixed aspect of these connecting means between the simulator and the components was poorly compatible with the numerous envisioned changes, because of the continuous evolution of the definition of the system (typically an airplane) in the course of its development, or of more traditional changes.

The solution adopted heretofore consisted in reproducing (almost continuously) the cabling between the airplane components and the cutoff and visual display boxes, by adhering to the pre-assignments of contacts (names of airplane signals indicated on the labels facing each switch associated with a connector) in order to accompany the evolution of the definition of the airplane, which was naturally time-consuming given the large number of connecting cables.

In this context, the invention proposes a system for connecting a plurality of contacts to a computer system, characterized in that it comprises a plurality of channels, each connected to a contact and being selectively configurable in a first mode of acquisition of a signal present on the contact or in a second mode of application of a signal to the contact; and a unit (distinct from the computer system) connected to the computer system by a computer network and designed to control the configured channels in the second mode of application of a signal as a function of data received from the computer system and to transmit to the computer system data representative of signals measured by the channels configured in the first mode.

In this way each channel can be configured flexibly, and the unit is able to exchange, with the computer system (typically a simulator), data corresponding to the signals applied or measured at the contacts connected to the channels.

The unit is designed, for example, to configure each of the said channels in the first mode or in the second mode, if necessary as a function of a corresponding instruction received from the computer system. In this way the unit acts as an intermediary not only for exchange of the already cited data but also for configuration of the channels.

It may be provided, for example, in the case of discrete signals, that each channel is capable of selectively applying a high voltage or a low voltage in the second mode and of selectively detecting a high voltage or a low voltage in the first mode. Nevertheless, the invention is applicable to other types of signals, such as analog or digital signals.

Furthermore, the unit may be provided in its memory with a correspondence table defining the association of at least one channel with a function managed in the computer system. In this way flexibility of configuration of the different channels is achieved.

The correspondence table may be modified by a user interface, for example integrated in the unit, such as a screen and an acquisition tool (computer keyboard). Along the same line of thought, the user interface may define the signal applied in the second mode and/or display an element representative of the signal measured by at least one channel.

In an advantageous application already mentioned in the introduction, the computer system comprises a simulator.

Thus the invention also proposes a simulator connected to a plurality of contacts by means of a connection system that has just been discussed.

Other characteristics and advantages of the invention will become apparent from reading the description hereinafter, provided with reference to the attached drawings, wherein.

Figure 1:
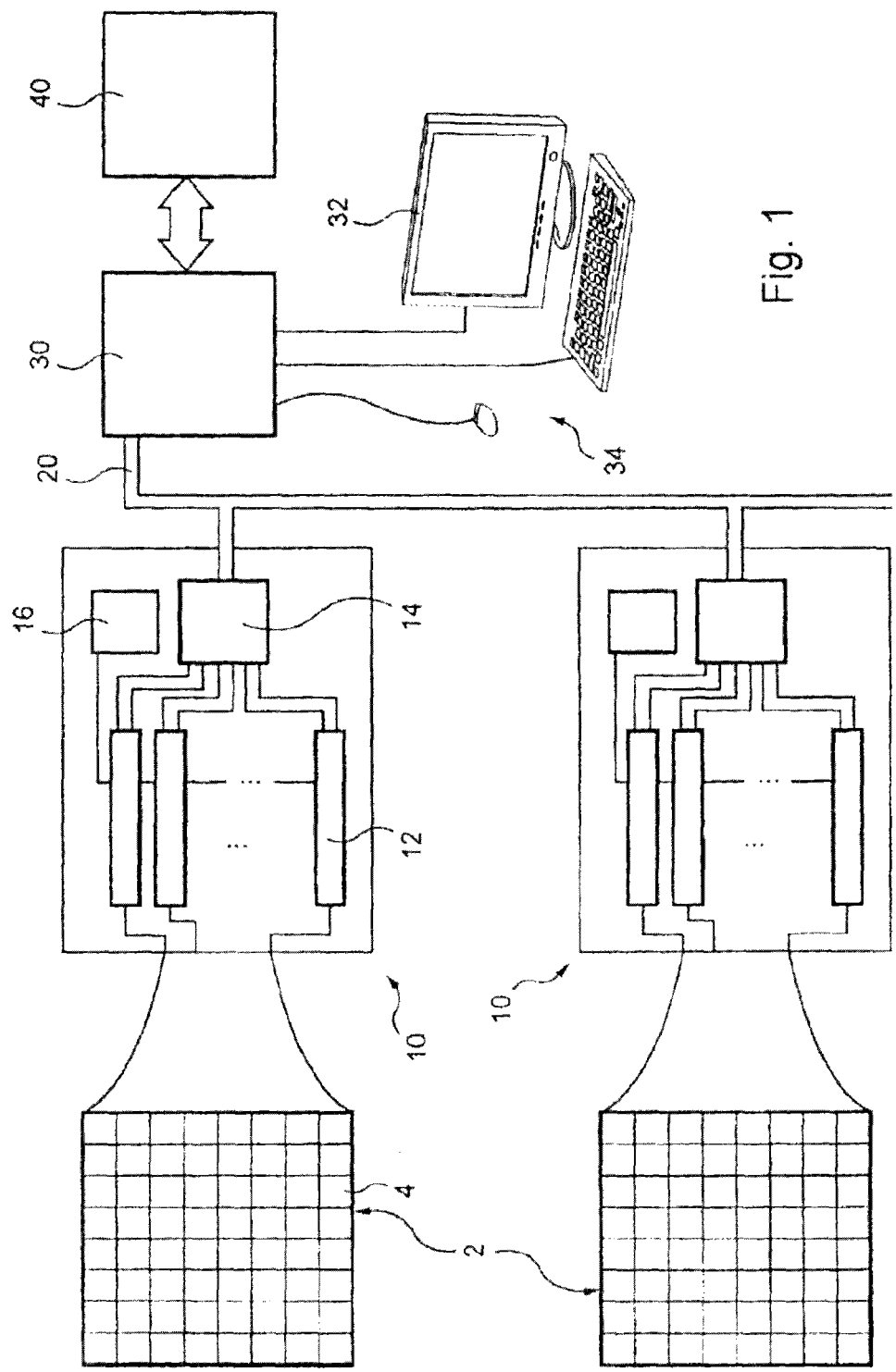
FIG. 1 represents the principal elements of an exemplary connection system in conformity with the teachings of the invention.

The connection system illustrated in FIG. 1 comprises several terminal blocks 2, each comprising a plurality of contacts 4 (64 contacts in this case).

A cable originating from an airplane component (or element) to be tested may be connected to each of these contacts.

An electronic card 10 is connected to each terminal block 2 and comprises as many channels 12 as terminal block 2 has contacts 4 (or 64 channels in this case), so that each channel 12 is connected to a given contact 4. The structure and operation of a channel are described hereinafter by way of example with reference to FIG. 2.

All channels 12 of electronic card 10 are connected to a common microprocessor 14. In this regard it is noted that each channel 12 is connected to microprocessor 14 by means of several connecting lines, as will be described hereinafter with reference to FIG. 3.

As a function of instructions received from a configuration system 30, the microprocessor is able to invert the operation of each channel 12 between a read (or acquisition or else input) mode of the electrical signal present on contact 4 associated with channel 12 in question and a write (or application or else output) mode of a signal determined on this same contact 4.

The signal applied in output mode is determined by microprocessor 14, also as a function of instructions received from configuration system 30.

In the example described here, the signals under consideration are discrete signals (namely that they may have a low-voltage value $V_0$ or a high-voltage $V_1$). As described in more detail with reference to FIG. 2, microprocessor 14 therefore controls, in output mode, the application of a voltage generated by a supply 16 of electronic card 10 to channel 12 in question.

Microprocessor 14 of each card 10 is connected to already mentioned configuration system 30 via a computer network, for example of Ethernet type, which permits the exchange of data between microprocessor 14 and configuration system 30.

The exchanged data are mainly the following:
on the one hand, the configuration instructions transmitted by configuration system 30 and received by each microprocessor 14 in question, on the basis of which microprocessor 14 controls the mode of operation of channel 12 in question via the received instruction;
on the other hand, data representative of values measured by microprocessor 14 on each of channels 12 operating in input mode, which data are intended for configuration system 30;
finally, control instructions transmitted by configuration system 30 to microprocessor 14, and on the basis of which the latter controls, on channel 12 targeted by the particular control instruction, the application of a voltage corresponding to that control instruction.

The configuration instructions and the control instructions transmitted by configuration system 30 are those chosen by a user, typically with the aid of a user interface, such as a screen 32 and an acquisition tool 34 (represented here in the form of a keyboard and a mouse), integrated in configuration system 30.

Furthermore, screen 32 permits visual display, if necessary, of values measured on the channels in input mode (values represented by the data transmitted from each microprocessor 14 to configuration system 30).

Configuration system 30 also stores in memory the association that may exist between each contact 4 (in other words between each channel 12 associated with this contact) and a function provided in the system to be tested, for example by means of a correspondence table.

Configuration system 30 also makes it possible to modify this association (in other words in practice to modify the correspondence table) upon command from the user with the aid of user interface 32, 34.

In this way the user may very easily define (or modify) the association between a given contact 4 and the function, in the system to be tested, of the signal received or transmitted via this contact. In this way, configuration system 30 may exchange data with a simulator 40 (computer system distinct from configuration system 30) according to the function defined for these data in the correspondence table.

For example, the signals generated by simulator 40 and received in the form of data at configuration system 30 are applied to card 10 and to the channel 12 on this card defined in the correspondence table as associated with the function of the received datum.

Similarly, when a signal is measured by a channel 12 of a certain card 10, the datum representative of this measurement is transmitted to simulator 40 as a datum representing the function associated with channel 12 and with card 10 in question in the correspondence table.

In this way it is easy for the user, by modifying the correspondence table, to change the allocation of a contact 4 to a given function in simulator 40, without having to modify the connections in terminal blocks 2.

Figure 2:
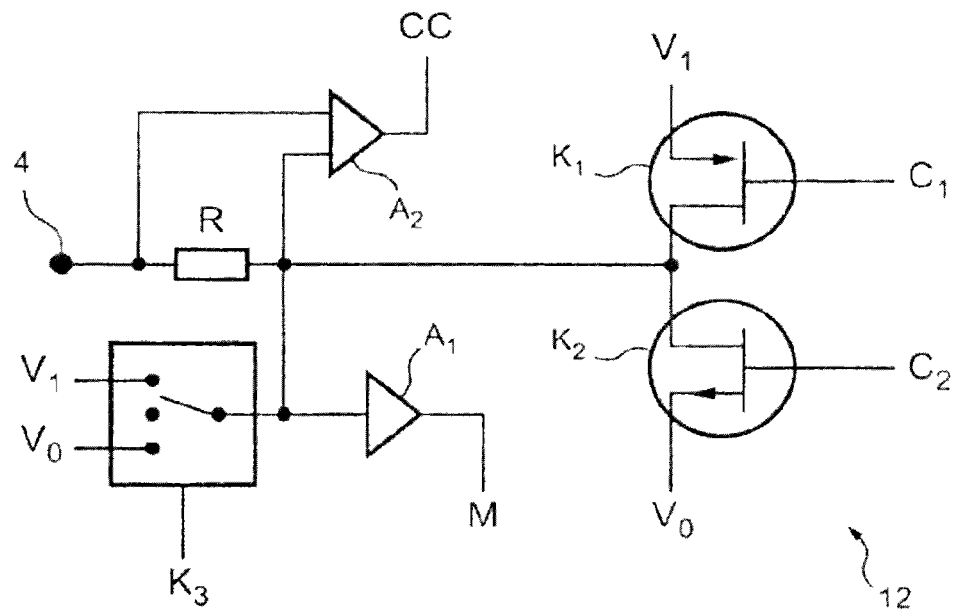
FIG. 2 represents the principal elements of a channel present on a card of the system of FIG. 1.

The block diagram of a channel 12 has been represented in FIG. 2.

The point of connection of channel 12 to contact 4 is connected directly to a first input of an amplifier A2 and by way of a resistor R to a second input of this amplifier A2.

In this way amplifier A2 detects possible short circuits in the channel and at its output generates a corresponding signal CC to protective circuits of card 10.

As can be seen in FIG. 2, the point connected to the second input of amplifier A2 is also connected to the input of an amplifier A1, which input may be additionally connected either to the high voltage $V_1$ (28 volt in the example described here) or to the low voltage $V_0$ (here connected to ground), or to a non-connected pin, as a function of a control signal $K_3$ received from microprocessor 14.

In this way the presence of a voltage which may or may not correspond to that selected according to control signal $K_3$ is detected at contact 4. The value M generated at the output of amplifier A1 (which therefore represents the signal measured at contact 4) is transmitted to microprocessor 14.

The point connected to the second input of amplifier A2 may additionally be connected to the high voltage $V_1$ (by means of a switch $K_1$ controlled by a control signal $C_1$ generated by microprocessor 14) or to the low voltage $V_0$ by means of a switch $K_2$ controlled by a control signal $C_2$, also generated by microprocessor 14.

When microprocessor 14 must cause channel 12 to operate in input mode (upon instruction from configuration system 30 received via network 20), it controls the opening of the two switches $K_1$, $K_2$ (by means of control signals $C_1$, $C_2$ respectively). In this way the signal present at contact 4 can be read (in other words measured), as has just been indicated.

On the other hand, when microprocessor 14 must control channel 12 in output mode, it commands either switch $K_1$ (via control signal $C_1$) or switch $K_2$ (by virtue of control signal $C_2$) to apply the desired voltage (determined as a function of instructions received by microprocessor 14 of configuration system 30) to contact 4.

Figure 3:
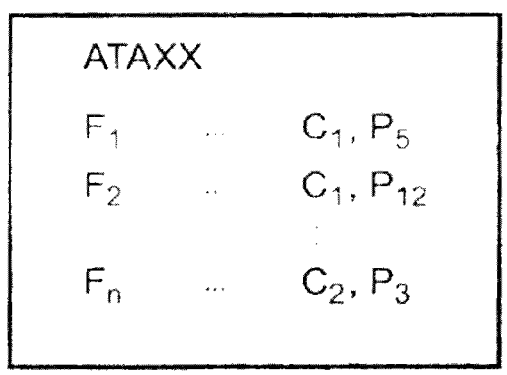
FIG. 3 represents an exemplary interactive screen permitting configuration of the connections in the system of FIG. 1.

FIG. 3 represents a possible example of a display intended for a system user on screen 32 of FIG. 1.

This display makes it possible to show the user the current association of functions $F_1, F_2 \ldots F_n$ of a family of ATAXX functions with a corresponding set of contacts $P_i$ of diverse cards $C_j$, such as stored in memory in the already mentioned correspondence table.

In this way, for example, the signal corresponding to ATAXX function $F_1$ is present at contact $P_5$ of electronic card $C_1$.

A display of this type, together with means for modifying the correspondence table represented by it (such as acquisition means 34), permits the user to modify the allocation of a function to a given contact easily, and likewise to modify the configuration (in output mode or in input mode) of the channel associated with this same contact.

The correspondence table defined in this way may be, for example, saved in configuration system 30 in order to be used again later (even if other modifications were employed in the interim).

Furthermore, in addition to the simplicity of modification of the configuration by the user, the use of a software definition of the association between the different contacts and the different functions on the simulator side achieves other advantages, such as personalized displays of visually displayed functions.

The foregoing examples are merely possible embodiments of the invention, which is not limited thereto.

In particular, the signals under consideration may be analog or digital, especially discrete or in the format of standards, for example of data bus type.

The invention claimed is:

1. A system for connecting a plurality of contacts to a computer system, the system comprising:

a plurality of channels, each connected to a contact of the plurality of contacts and being selectively configurable in a first mode of acquisition of a signal present on the contact or in a second mode of application of a signal to the contact; and circuitry connected to the computer system by a computer network and configured to control the configured channels in the second mode of application of a signal as a function of data received from the computer system and to transmit to the computer system data representative of signals measured by the channels configured in the first mode, the circuitry further being configured to store in memory a correspondence table defining association of at least one channel with a function managed in the computer system and to modify the correspondence table upon command from a user interface, the circuitry including a first switch that connects the contact to a first voltage, and a second switch that connects the contact to a second voltage which is lower than the first voltage, and a third switch that connects the contact to one of the first voltage, the second voltage, and an open pin, the circuitry including a first amplifier including a first input that is connected directly to the contact and a second input that is connected to the contact through a resistor, the second input also being connected to the third switch, the first amplifier being configured to detect a short circuit of the channel of the contact, the circuitry including a second amplifier including a third input that is connected to the contact and to the third switch, the second amplifier being configured to measure a voltage of the contact in the first mode, and wherein either of the first switch or the second switch is closed in the second mode and each of the first switch and second switch are open in the first mode.

2. A connection system according to claim 1, wherein the circuitry is further configured to configure each of the channels in the first mode or in the second mode.

3. A connection system according to claim 2, wherein the circuitry is further configured to configure the channel as a function of a corresponding instruction received from the computer system.

4. A connection system according to claim 1, wherein the user interface comprises a screen and an acquisition tool.

5. A connection system according to claim 1, wherein the user interface is configured to define the signal applied in the second mode.

6. A connection system according to claim 1, wherein the user interface is configured to display an element representative of the signal measured by at least one channel.

7. A connection system according to claim 1, wherein the computer system comprises a simulator.

8. A simulator connected to a plurality of contacts by a connection system according to claim 1.

9. A connection system according to claim 1, wherein outputs of both of the first switch and the second switch are connected to the contact through the resistor.

* * * * *